United States Patent
Kim

(10) Patent No.: US 7,348,243 B2
(45) Date of Patent: Mar. 25, 2008

(54) SEMICONDUCTOR DEVICE AND METHOD FOR FABRICATING THE SAME

(75) Inventor: Hag Dong Kim, Kyeonggido (KR)

(73) Assignee: Dongbu Electronics Co., Ltd., Seoul (KR)

( * ) Notice: Subject to any disclaimer, the term of this patent is extended or adjusted under 35 U.S.C. 154(b) by 277 days.

(21) Appl. No.: 11/021,638

(22) Filed: Dec. 24, 2004

(65) Prior Publication Data
US 2005/0142771 A1    Jun. 30, 2005

(30) Foreign Application Priority Data
Dec. 27, 2003   (KR) ...................... 10-2003-0098079
Dec. 27, 2003   (KR) ...................... 10-2003-0098092

(51) Int. Cl.
*H01L 21/336*     (2006.01)

(52) U.S. Cl. ............... 438/268; 438/291; 257/E21.618; 257/E21.629

(58) Field of Classification Search ............... 438/206, 438/209, 268, 291; 257/E21.618, E21.629
See application file for complete search history.

(56) References Cited

U.S. PATENT DOCUMENTS 5,177,027 A * 1/1993 Lowrey et al. ............. 438/270
5,302,843 A * 4/1994 Yamazaki ................... 257/296

* cited by examiner

*Primary Examiner*—Chandra Chaudhari
(74) *Attorney, Agent, or Firm*—Andrew D. Fortney

(57) ABSTRACT

A transistor and a method for fabricating the same is disclosed, to uniformly provide impurity ions in impurity areas, and to prevent a short channel effect, in which the method for fabricating the transistor includes steps of forming a plurality of channel ion implantation areas having different depths in a first conductive type semiconductor substrate; forming a pillar by selectively etching the first conductive type semiconductor substrate; sequentially depositing a gate insulating layer and a conductive layer for a gate electrode on the first conductive type semiconductor substrate including the pillar; forming the gate electrode by selectively patterning the conductive layer; and forming second conductive type source/drain impurity ion areas in the first conductive type semiconductor substrate corresponding to the top of the pillar and both sidewalls of the pillar.

20 Claims, 8 Drawing Sheets

SEMICONDUCTOR DEVICE AND METHOD FOR FABRICATING THE SAME

CROSS-REFERENCE TO RELATED APPLICATIONS

This application claims the benefit of Korean Application Nos. P2003-98092 and P2003-98079, filed on Dec. 27, 2003, which is hereby incorporated by reference as if fully set forth herein.

BACKGROUND OF THE INVENTION

1. Field of the Invention

The present invention relates to a semiconductor device, and more particularly, to a vertical transistor and a method for fabricating the same, to improve operation reliability of the transistor and to realize minuteness in the semiconductor device.

2. Discussion of the Related Art

With high integration of a semiconductor device, a size of the semiconductor device decreases, whereby a channel length of the semiconductor device also decreases. According to the decrease of the channel length in the semiconductor device, there may be the undesirable electric characteristics, for example, a short channel effect.

In order to overcome the short channel effect, it is necessary to realize the vertical decrease such as the decrease in thickness of a gate insulating layer and a junction depth of source/drain as well as the horizontal decrease such as the decrease in length of a gate electrode. Also, according to the horizontal and vertical decrease, a voltage of applying power lowers, and a doping density of a semiconductor substrate increases. Especially, there is demand for effective control of the doping profile of a channel region.

However, on the decrease in size of the semiconductor device, an operation power for electronic equipment is not low. For example, in case of an NMOS transistor, injected electrons of the source are excessively accelerated in state of a high potential gradient, so that hot carriers generate. Accordingly, an LDD (Lightly Doped Drain) structure having an improved NMOS transistor has been researched and developed.

In the LDD-structure transistor, a lightly doped n-type ($n^-$) region is positioned between a channel and a highly doped n-type ($n^+$) source/drain, and the lightly doped n-type ($n^-$) region buffers a high drain voltage around the drain junction, so that it is possible to prevent inducement of the rapid potential gradient, thereby preventing the generation of hot carriers. On research for the technology of the high-integration semiconductor device, various methods for fabricating an MOSFET of the LDD structure have been proposed. Among them, the method for forming the LDD structure by forming spacers at sidewalls of the gate electrode is most generally used.

However, according to the high integration in the semiconductor device, it is impossible to perfectly control the short channel effect with the LDD structure. To satisfy this request for the optimal structure of minimizing the short channel effect, a vertical transistor is proposed, which is suitable for realizing minuteness in the semiconductor device by decreasing the channel length.

In the vertical transistor, the channel region is formed in vertical, whereby the channel length is determined dependent on not a width of an active region but a thickness of the active region. As compared with a conventional plane-type transistor, the vertical transistor has the advantageous characteristics such as the decrease of the channel length without photolithography.

However, the related art vertical transistor has the following disadvantages. In the related art vertical transistor, the channel is formed in vertical, whereby it has difficulties in uniformly implanting impurity ions to form impurity ions areas, and in minimizing the short channel effect. As a result, the related art vertical transistor may have the misoperation.

SUMMARY OF THE INVENTION

Accordingly, the present invention is directed to a minute transistor and a method for fabricating the same that substantially obviates one or more problems due to limitations and disadvantages of the related art.

An object of the present invention is to provide a minute transistor and a method for fabricating the same, to uniformly provide impurity ions in impurity areas, and to prevent a short channel effect.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating a semiconductor device includes steps of forming a plurality of channel ion implantation areas having different depths in a first conductive type semiconductor substrate; forming a pillar by selectively etching the first conductive type semiconductor substrate; sequentially depositing a gate insulating layer and a conductive layer for a gate electrode on the first conductive type semiconductor substrate including the pillar; forming the gate electrode by selectively patterning the conductive layer; and forming second conductive type source/drain impurity ion areas in the first conductive type semiconductor substrate corresponding to the top of the pillar and both sidewalls of the pillar.

In addition, the method includes steps of forming an insulating interlayer on an entire surface of the first conductive type semiconductor substrate including the gate electrode; forming contact holes in the insulating interlayer to expose predetermined portions of the source/drain impurity ion areas and the gate electrode; and forming electrodes for being electrically connected with the source/drain impurity ion areas and the gate electrode by the contact holes.

At this time, the channel ion implantation areas are comprised of at least three layers of a first channel ion area formed by implanting impurity ions at an energy between 10 KeV and 30 KeV and a density between 1E14 and 5E14 ions/cm$^2$, a second channel ion area formed by implanting impurity ions at an energy between 30 KeV and 70 KeV and a density between 1E14 and 5E14, and a third channel ion area formed by implanting impurity ions at an energy between 70 KeV and 100 KeV and a density between 1E14 and 5E14 ions/cm$^2$.

Also, the plurality of channel ion implantation areas are formed at a depth between 1 μm and 2 μm from the surface of the first conductive type semiconductor substrate.

Also, a height of the pillar corresponds to a depth of the plurality of channel ion implantation areas.

Also, the pillar is formed at a height between 1 μm and 2 μm.

Also, the gate electrode is formed at a sidewall of the pillar, and a predetermined portion of the gate electrode is formed on the etched surface of the semiconductor substrate as well as at the sidewall of the pillar.

Also, the process of forming the second conductive type source/drain impurity ion areas includes steps of directionally implanting second conductive type impurity ions at an energy between 3 KeV and 50 KeV and a density between 1E14 and 5E14 ions/cm$^2$; and activating the second conductive type impurity ions by performing a thermal process to the semiconductor substrate to which the second conductive type impurity ions are implanted.

Also, the second conductive type impurity ions are implanted at an angle between 5° and 20° to a vertical axis of the surface of the semiconductor substrate.

Also, the thermal process is performed in an inert gas atmosphere at a temperature between 800° C. and 1000° C., for 10 to 30 seconds.

In another aspect, a method for fabricating a semiconductor device includes steps of forming a pillar by selectively etching a first conductive type semiconductor substrate; forming first conductive type halo-ion areas in the surface of the first conductive type semiconductor substrate corresponding to the pillar and both sides of the pillar; forming second conductive type impurity ions areas on the halo-ion areas in the surface of the first conductive type semiconductor substrate corresponding to the pillar and both sides of the pillar; depositing a gate insulating layer and a conductive layer for a gate electrode on an entire surface of the first conductive type semiconductor substrate including the pillar; forming the gate electrode by selectively patterning the gate insulating layer and the conductive layer; and forming a spacer at a sidewall of the gate electrode.

At this time, the halo-ions areas are formed by implanting the first conductive type impurity ions at an energy between 5 KeV and 50 KeV and a density between 1E14 and 5E14 ions/cm$^2$.

Also, the first conductive type halo-ion areas are formed by implanting halo-type ions at an angle between 5° and 30° to a vertical axis of the surface of the first conductive type semiconductor substrate.

In another aspect, a method for fabricating a semiconductor device includes steps of forming a sacrificial oxide layer on a first conductive type semiconductor substrate; forming an aperture in the sacrificial oxide layer to expose a predetermined portion of the first conductive type semiconductor substrate; forming a polysilicon layer in the aperture; removing the sacrificial oxide layer; forming first conductive type halo-ion areas in the polysilicon layer and the first conductive type semiconductor substrate at both sides of the polysilicon layer; forming second conductive type impurity ion areas on the halo-ion areas formed in the polysilicon layer and the first conductive type semiconductor substrate at both sides of the polysilicon layer; sequentially depositing a gate insulating layer and a conductive layer for a gate electrode on an entire surface of the first conductive type semiconductor substrate including the polysilicon layer; forming a gate electrode by selectively patterning the gate insulating layer and the conductive layer; and forming a spacer at a sidewall of the gate electrode.

At this time, the sacrificial oxide layer is formed at a thickness between 1000 Å and 5000 Å.

In another aspect, a semiconductor device includes a first conductive type semiconductor substrate having a pillar; a plurality of channel ion implantation areas in the pillar; a gate insulating layer on an entire surface of the first conductive type semiconductor substrate including the pillar; second conductive type source/drain impurity areas in the surface of the pillar and the surface of the first conductive type semiconductor substrate at both sides of the pillar; and a gate electrode on the gate insulating layer at the side of the pillar.

In another aspect, a semiconductor device includes a first conductive type semiconductor substrate having a pillar; first conductive type halo-ion areas in the pillar and the surface of the first conductive type semiconductor substrate at both sides of the pillar; second conductive type impurity ion areas on the halo-ion areas formed in the pillar and the surface of the first conductive type semiconductor substrate at both sides of the pillar; a gate insulating layer on an entire surface of the first conductive type semiconductor substrate including the pillar; and a gate electrode on the gate insulating layer at the side of the pillar.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a transistor and a method for fabricating the same according to the present invention will be described with reference to the accompanying drawings.

FIG. 1A to FIG. 1E show cross sectional views of the fabrication process for a vertical transistor according to the first embodiment of the present invention.

Figure 1A:
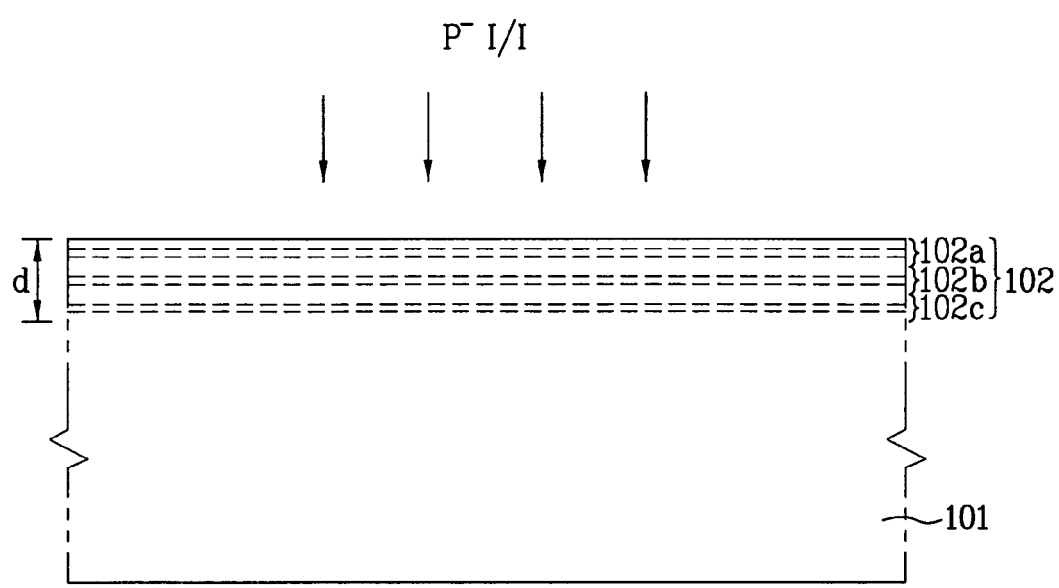
FIG. 1A to FIG. 1E show cross sectional views of the fabrication process for a vertical transistor according to the first embodiment of the present invention.

First, as shown in FIG. 1A, a semiconductor substrate 101 of mono-crystal silicon is prepared. The semiconductor substrate 101 may be n-type or p-type mono-crystal silicon substrate. For convenience of explanation, herein, the p-type mono-crystal silicon substrate will be described as follows.

In this case, channel ion implantation process is performed to the semiconductor substrate 101 third times, so as to uniformly provide channel ions in a channel ion area 102. That is, the channel ion area formed by implanting the channel ions three times corresponds to a channel of a vertical transistor.

Meanwhile, the channel ion implantation process will be described in detail.

First, first conductive (p-type) impurity ions, for example, boron B ions are implanted in a first channel ion implantation at an energy between 10 KeV and 30 KeV and a density between 1E14 and 5E14 ions/cm$^2$, thereby forming a first channel ion area 102a. Then, p-type impurity ions are implanted in a second channel ion implantation at an energy between 30 KeV and 70 KeV and a density between 1E14 and 5E14 ions/cm$^2$, whereby a second channel ion area 102b is formed below the first channel ion area 102a. Subsequently, p-type impurity ions are implanted in a third channel ion implantation at an energy between 70 KeV and 100 KeV and a density between 1E14 and 5E14 ions/cm$^2$, whereby a third channel ion area 102c is formed below the second channel ion area 102b. According to the three-step channel ion implantation process, it is possible to form the channel ion area 102 of the first, second, and third channel ion areas 102a, 102b, and 102c.

The channel ion area 102 has a thickness 'd'. However, it is possible to selectively change the thickness of the channel ion area 102 dependent on a design rule of the transistor. Preferably, the thickness 'd' of the channel ion area 102 is provided at a degree between 1 μm and 2 μm from a surface of the semiconductor substrate 101.

Figure 1B:
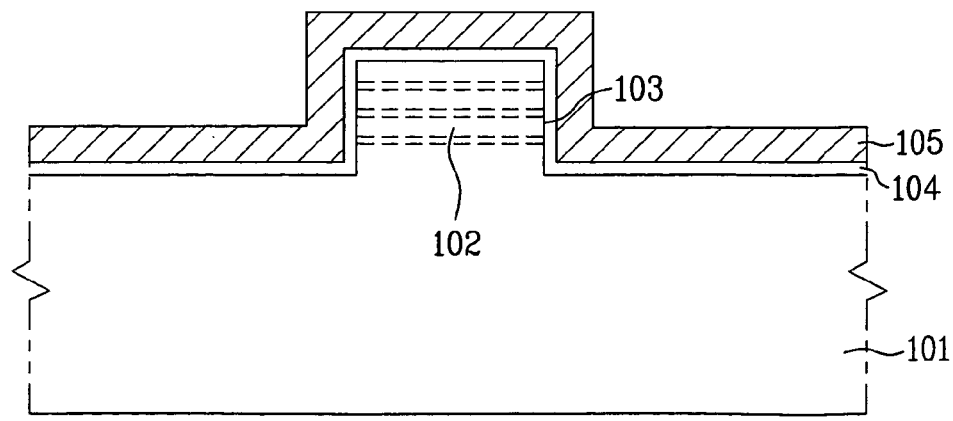

As shown in FIG. 1B, the semiconductor substrate 101 is selectively removed by dry etching such as RIE (Reactive Ion Etching) using photolithography, thereby forming a predetermined pillar 103. At this time, the semiconductor substrate 101 is etched at a thickness between about 1 μm and 2 μm.

Although not shown, a buffering oxide layer may be deposited on an entire surface of the semiconductor substrate 101 before the dry etching process, so as to cure the surface of the semiconductor substrate 101 damaged due to the dry etching process. After the dry etching process, the buffering oxide layer may be removed.

After that, a thermal-oxidation process is performed to the entire surface of the semiconductor substrate 101 including the pillar 103, so that a gate insulating layer 104 is formed at a thickness between 10 Å and 50 Å. Subsequently, a conductive layer 105 for forming a gate electrode is formed on the gate insulating layer 104 at a thickness between 1000 Å and 3000 Å.

Figure 1C:
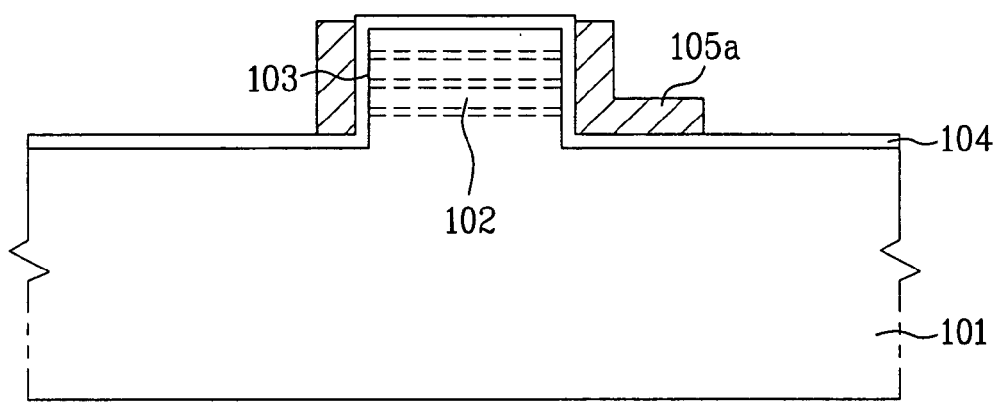

As shown in FIG. 1C, the conductive layer 105 is selectively removed in an etching process using photolithography, so that first gate electrodes 105a are formed at both sidewalls of the pillar 103. At this time, one of the first gate electrodes 105a is formed on a predetermined portion of the etched substrate surface as well as at the sidewall of the first gate electrode 105a.

Figure 1D:
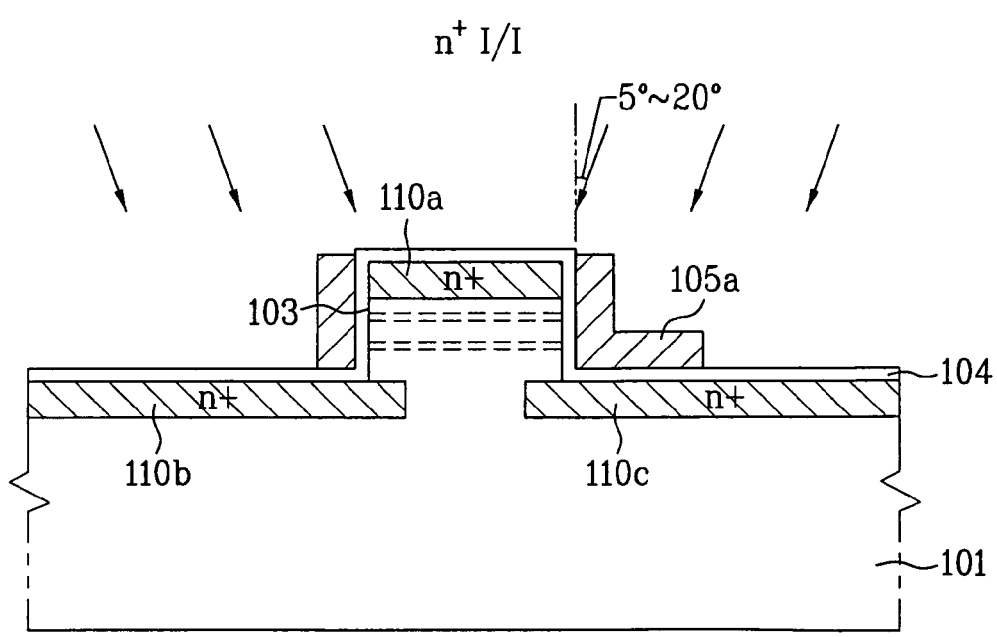

As shown in FIG. 1D, highly doped second conductive type (n$^+$) impurity ions, for example, arsenic As ions are implanted to the entire surface of the substrate 101 at an energy of 3 KeV and 50 KeV and a density between 1E14 and 5E14 ions/cm$^2$, thereby forming highly doped impurity ion areas 110a, 110b, and 110c in the top of the pillar 103 and in the surface of the semiconductor substrate 101 at the left and right sides of the pillar 103. At this time, the highly doped impurity ions are implanted at a predetermined angle, for example, at an angle between 5° and 20° to a vertical axis of the surface of the semiconductor substrate 101. Accordingly, it is possible to form the highly doped impurity ion areas 110a, 110b, and 110c in the top of the pillar 103 as well as in the surface of the semiconductor substrate at the both sides of the pillar 103. The highly doped impurity ion areas serve as source/drain regions.

After implantation of the impurity ions, a thermal process is performed to the semiconductor substrate 101, thereby activating the impurity ions implanted to the channel ion area 102 and the highly doped impurity ion areas 110a, 110b, and 110c. As a result, the highly doped impurity ion areas are formed of junction areas. At this time, the thermal process is performed by a rapid treatment in an inert gas atmosphere of nitrogen N at a temperature between 800° C. and 1000° C., for 10 to 30 seconds.

Figure 1E:
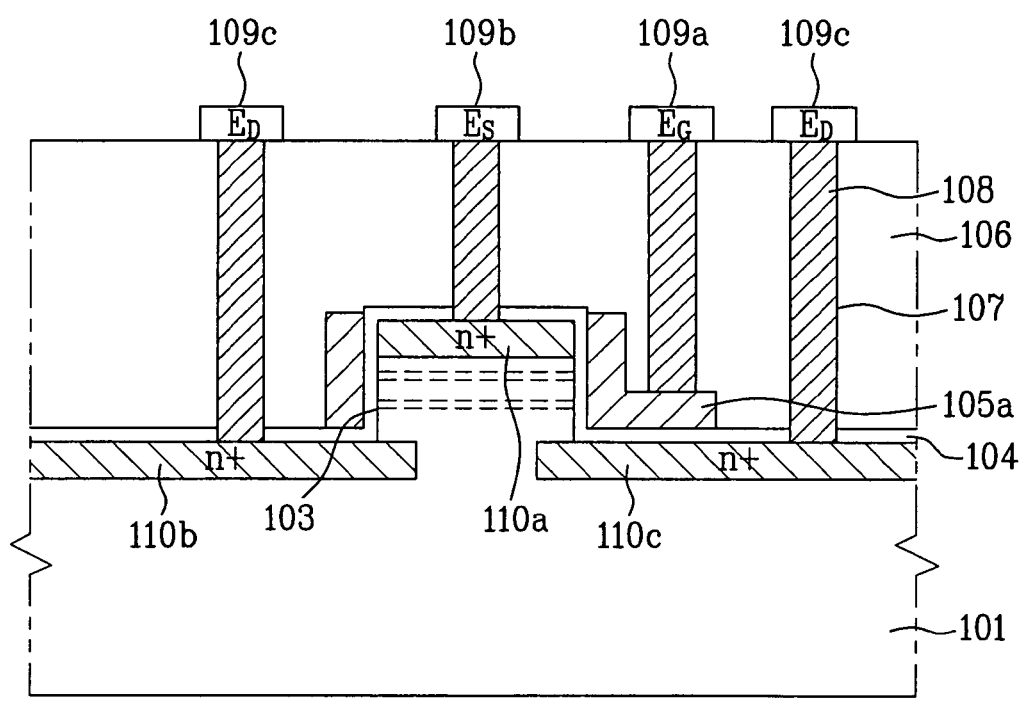

As shown in FIG. 1E, an insulating interlayer 106 is deposited on the entire surface of the semiconductor substrate 101 including the first gate electrodes 105a. Then, the insulating interlayer 106 and the gate insulating layer 104 are selectively removed by photolithography and etching, whereby contact holes 107 are formed on the first gate electrode 105a and the highly doped ion implantation areas 110a, 110b, and 110c. Subsequently, a metal layer is formed in the insulating interlayer 106 to fill the contact holes 107, and then is planarized to the insulating interlayer 106 by CMP, so that contact plugs 108 are formed in the contact holes 107. Then, another metal layer is deposited on the entire surface of the semiconductor substrate 101 including the contact plugs 108, and then is selectively patterned for being electrically connected with the contact plugs 108, thereby forming a second gate electrode 109a, a source electrode 109b, and a drain electrode 109c.

FIG. 2A to FIG. 2E show cross sectional views of the fabrication process for a vertical transistor according to the second embodiment of the present invention.

Figure 2A:
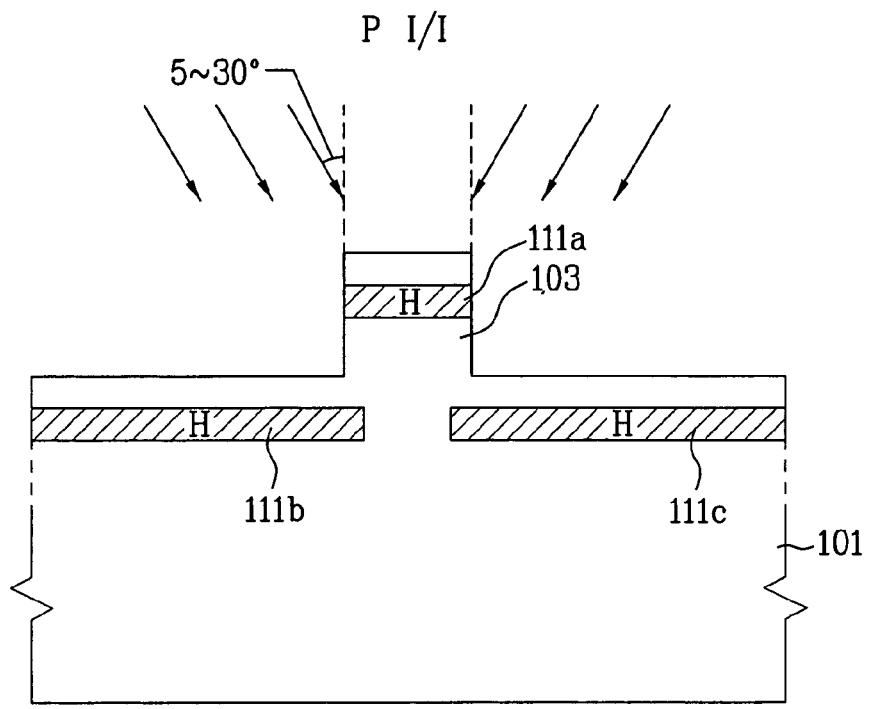
FIG. 2A to FIG. 2E show cross sectional views of the fabrication process for a vertical transistor according to the second embodiment of the present invention.

In the vertical transistor according to the second embodiment of the present invention, as shown in FIG. 2A, a semiconductor substrate 101 of mono-crystal silicon is prepared. The semiconductor substrate 101 may be formed of a first conductive type mono-crystal silicon, wherein the first conductive type may be n-type or p-type. For convenience of explanation, herein, the first conductive type will be explained as the p-type.

Then, the semiconductor substrate 101 is selectively removed by dry etching such as RIE (Reactive Ion Etching) using photolithography, thereby forming a predetermined pillar 103. At this time, the semiconductor substrate 101 is etched at a thickness between about 1 μm and 2 μm. Also, although not shown, a buffering oxide layer may be deposited on an entire surface of the semiconductor substrate 101 before the dry etching process, so as to cure the surface of the semiconductor substrate 101 damaged due to the dry etching process. After the dry etching process, the buffering oxide layer may be removed. Like the first embodiment of the present invention, a channel ion area of the vertical transistor may be preformed by implanting channel ions before forming the pillar 103.

After that, a halo-type ion implantation process is performed. That is, first conductive (p-type) impurity ions, for example, boron B ions are implanted to the entire surface of the semiconductor substrate 101 at an energy between 5 KeV and 50 KeV and a density between 1E14 and 5E14 ions/cm$^2$, thereby forming halo-ion areas 111a, 111b, and 111c in the surface of the semiconductor substrate 101 adjacent to the top and both sides of the pillar 103. At this time, the halo-type ions are implanted at a predetermined angle, for example, at an angle between 5° and 30° to a vertical axis of the surface of the semiconductor substrate 101.

Figure 2B:
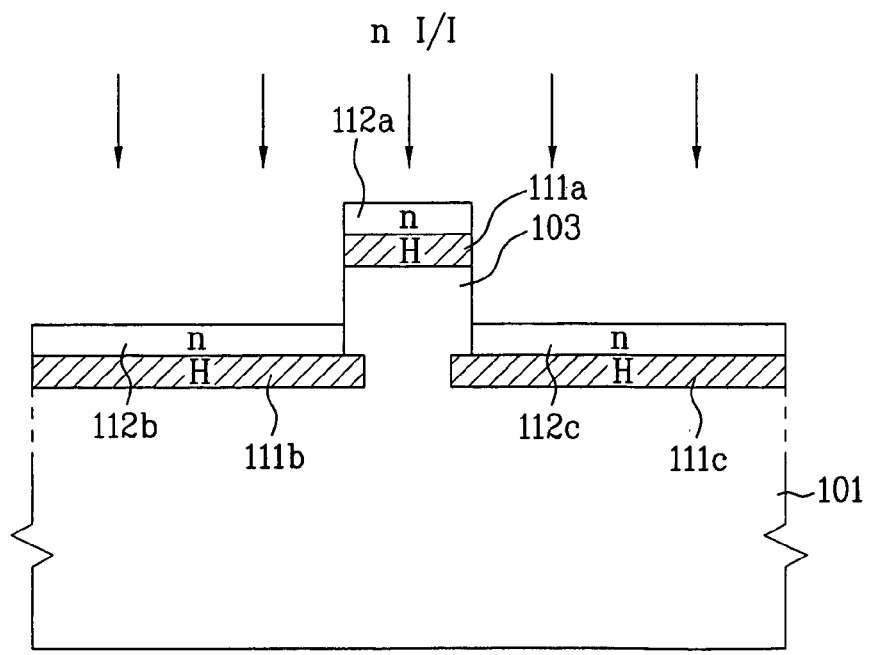

As shown in FIG. 2B, second conductive (n-type) impurity ions are implanted to form n-type impurity ion areas 112a, 112b, and 112c on the respective halo-ion areas 111a, 111b, and 111c. For example, the second conductive (n-type)

impurity ions such as arsenic As ions are implanted at an energy between 5 KeV and 50 KeV and a density between 1E14 and 5E14 ions/cm$^2$, whereby the highly doped impurity ion areas are formed of source/drain regions. At this time, the halo-ion areas 111a, 111b, and 111c have the opposite conductive type to the n-type impurity ion areas 112a, 112b, and 112c, whereby the halo-ion areas 111a, 111b, and 111c prevent the ions of the n-type impurity ion areas from being diffused to a channel region.

Figure 2C:
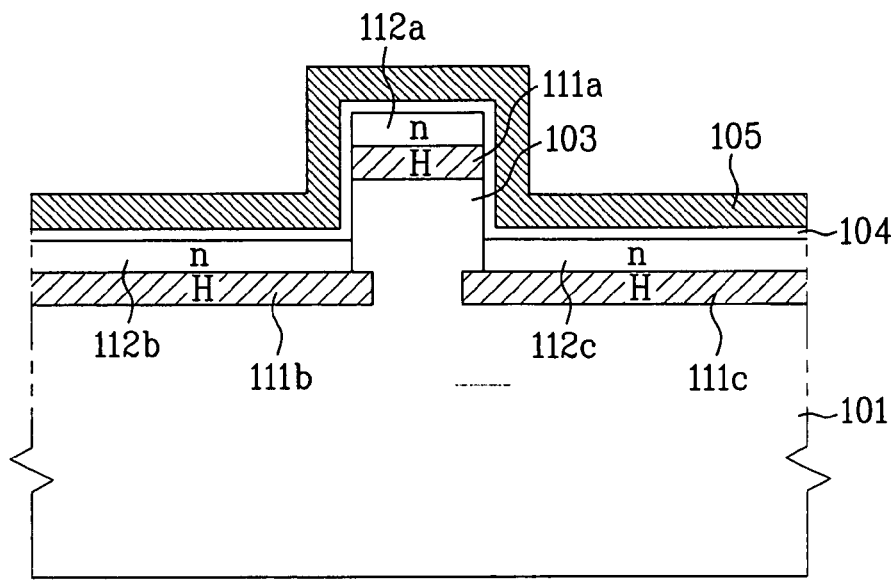

As shown in FIG. 2C, a gate insulating layer 104 and a conductive layer 105 for a first gate electrode 105a are sequentially formed on the entire surface of the semiconductor substrate 101 including the pillar 103. At this time, the gate insulating layer 104 is formed at a thickness between 10 Å and 30 Å, and the conductive layer 105 for the first gate electrode 105a is formed at a thickness between 1000 Å and 3000 Å.

Figure 2D:
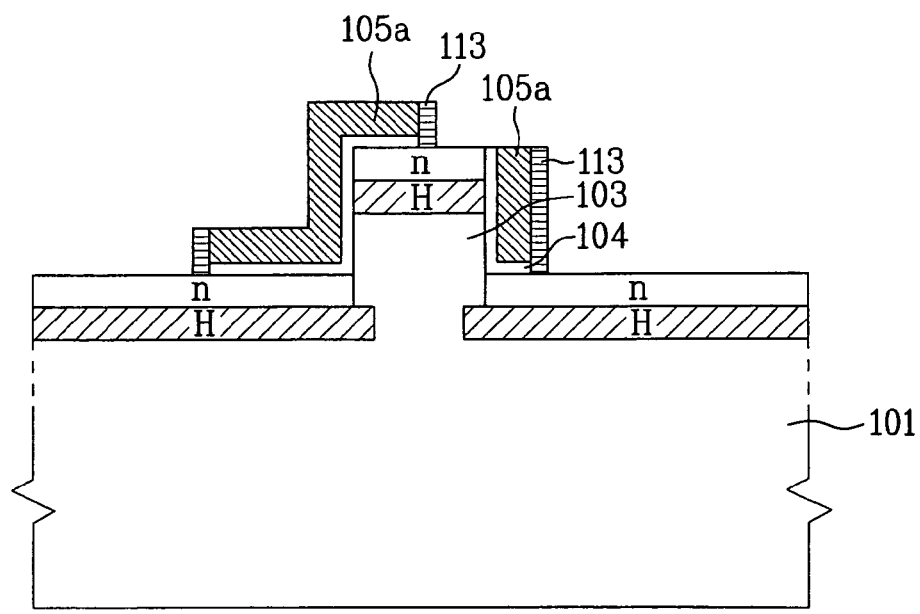

As shown in FIG. 2D, the conductive layer 105 and the gate insulating layer 104 are selectively removed by photolithography and etching, thereby forming the first gate electrodes 105a at both sidewalls of the pillar 103. At this time, one of the first gate electrodes 105a is formed on predetermined portions of a top surface of the pillar 103 and an etched surface of the semiconductor substrate adjacent to the pillar 103 as well as at the sidewall of the pillar 103.

In this state, an insulating layer is formed on the entire surface of the semiconductor substrate 101 including the first gate electrodes 105a, wherein the insulating layer is formed at a thickness between 600 Å and 2000 Å. The insulating layer may be formed of an oxide layer, a nitride layer, or a dual-layered structure of oxide layer/nitride layer. Then, the insulating layer is dry-etched until exposing the first gate electrodes 105a and the semiconductor substrate 101 in an etch-back process such as RIE (Reactive Ion Etching), thereby forming spacers 113. Accordingly, the spacers 113 are formed at sidewalls of the first gate electrodes 105a. The spacers 113 prevent the short between the first gate electrode 105a and the source/drain regions.

After that, a thermal process is performed to the semiconductor substrate 101, whereby the n-type impurity ion areas are activated. As a result, the n-type impurity ion areas are changed to junction areas. At this time, the thermal process is performed by a rapid treatment in an inert gas atmosphere of nitrogen N at a temperature between 900° C. and 1050° C., for about 10 to 30 seconds.

Figure 2E:
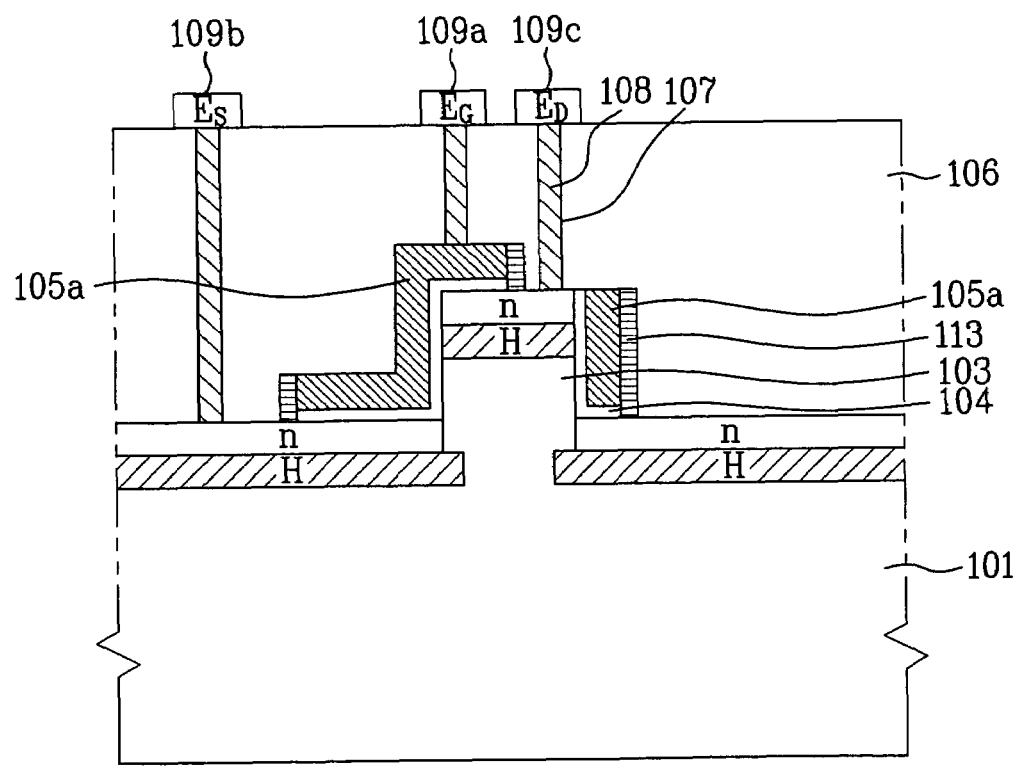

As shown in FIG. 2E, an insulating interlayer 106 is deposited on the entire surface of the semiconductor substrate 101 including the first gate electrodes 105a, and then is selectively removed by photolithography and etching, thereby forming respective contact holes 107 in the first gate electrode 105a and the n-type impurity ion areas 112a, 112b, and 112c. Subsequently, a metal layer is formed in the insulating layer 106 to fill the contact holes 107, and then the metal layer is planarized to the insulating layer 106 by CMP, thereby forming contact plugs 108 within the contact holes 107. Then, another metal layer is deposited on the entire surface of the semiconductor substrate 101 including the contact plugs 108, and is patterned for being electrically connected with the contact plugs 108, thereby forming a second gate electrode 109a, a source electrode 109b, and a drain electrode 109c.

Figure 3A:
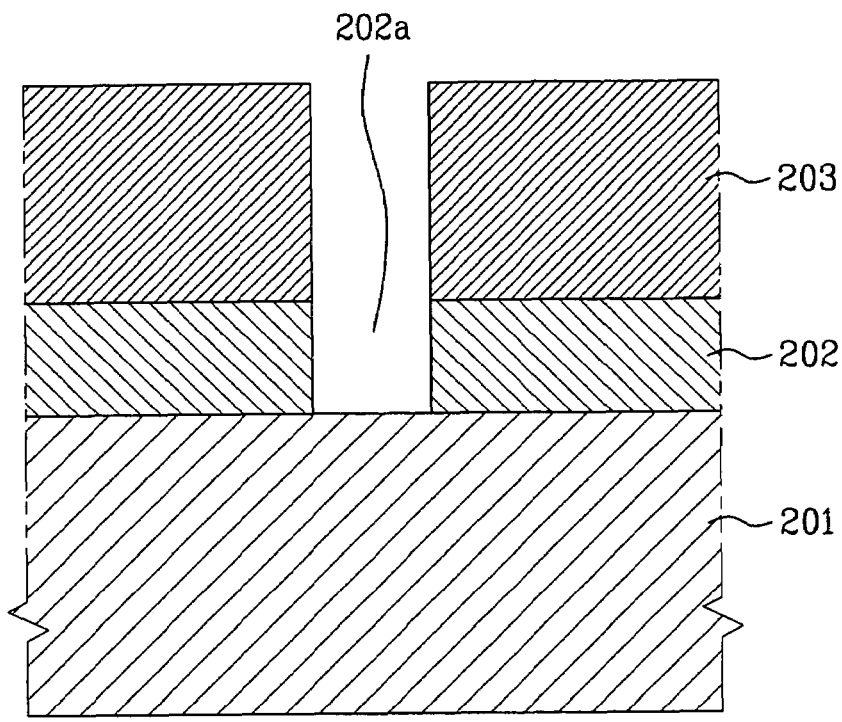
FIG. 3A to FIG. 3C show cross sectional views of the fabrication process for a vertical transistor according to the third embodiment of the present invention.
Figure 3B:
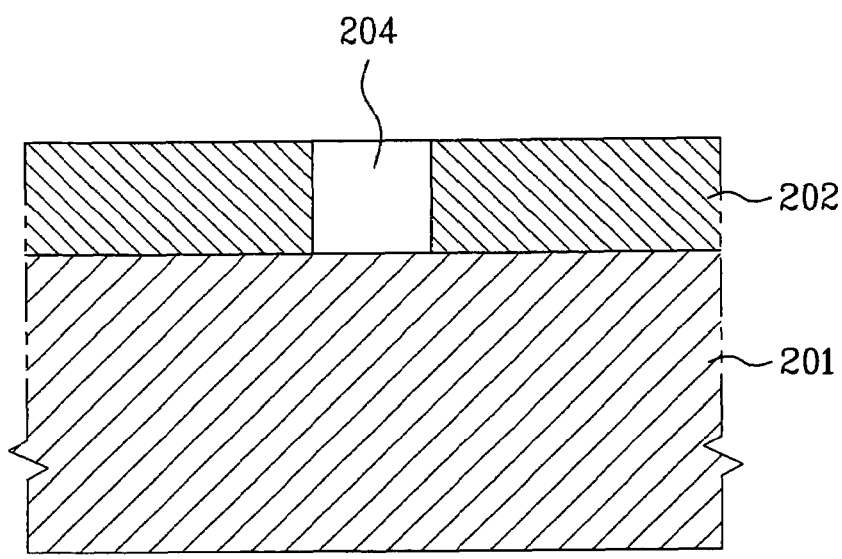
Figure 3C:
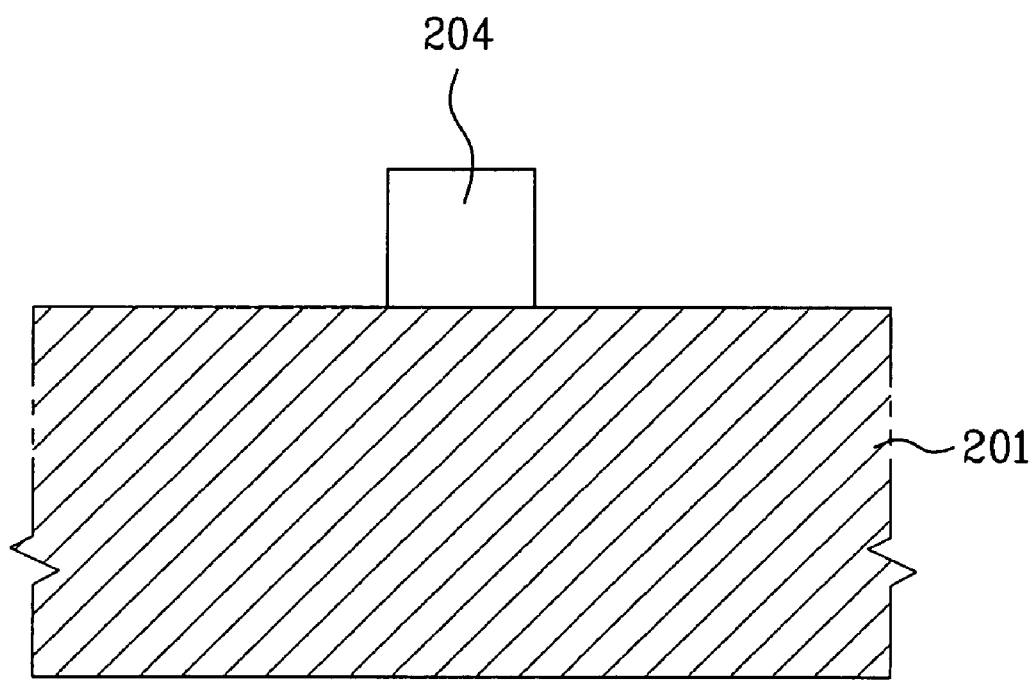

FIG. 3A to FIG. 3C show cross sectional views of the fabrication process for a vertical transistor according to the third embodiment of the present invention.

As shown in FIG. 3A, a sacrificial oxide layer 202 is formed on an entire surface of a p-type mono-crystal silicon semiconductor substrate 201 by spin coating or low-pressure CVD, wherein the sacrificial oxide layer 202 is formed at a thickness between 1000 Å and 5000 Å. Then, a photoresist layer is coated on the sacrificial oxide layer 202, and an exposure and development process is performed thereto, thereby forming a photoresist pattern 203 for exposing a predetermined portion of the sacrificial oxide layer 202. After that, the sacrificial oxide layer 202 is selectively removed to expose the semiconductor substrate 201 by using the photoresist pattern 203 as an etching mask, thereby forming an aperture 202a.

As shown in FIG. 3B, after removing the photoresist pattern 203, a polysilicon layer 204 is formed in the aperture 202a at a predetermined thickness by epitaxial growth. Preferably, the polysilicon layer 204 is formed at a thickness between 0.5 μm and 3 μm in due consideration of a channel length of the transistor.

Then, as shown in FIG. 3C, the sacrificial oxide layer 202 is removed. In this state, the vertical transistor according to the third embodiment of the present invention may be completed with the same following process steps for the first or second embodiment of the present invention. That is, the vertical transistor according to the third embodiment of the present invention may be fabricated according to the process steps of FIG. 1B to FIG. 1E of the first embodiment of the present invention, or according to the process steps of FIG. 2A to FIG. 2E of the second embodiment of the present invention.

As explained above, the method for fabricating the vertical transistor according to the present invention has the following advantages.

On forming the channel ion area of the vertical transistor according to the present invention, the channel ions are implanted to the corresponding channel ion areas at the different energy levels three times, whereby the channel ions are uniformly provided in the entire channel ion area. Accordingly, it is possible to improve the operation reliability of the transistor.

In the vertical transistor according to the present invention, the halo-ion areas are formed below the n-type impurity ion areas, so that it is possible to prevent the ions of the n-type impurity ion areas from being diffused to the channel region. As a result, it is possible to prevent the short channel effect, thereby improving the driving current.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a semiconductor device comprising:
    forming a pillar by selectively etching a first conductive type semiconductor substrate;
    forming first conductive type halo-ion areas in the surface of the first conductive type semiconductor substrate corresponding to the pillar and sides of the pillar;
    forming second conductive type impurity ion areas on the halo-ion areas;
    after forming the first conductive type halo-ion areas and the second conductive type impurity ion areas, depositing a gate insulating layer and a conductive layer for a gate electrode on an entire surface of the first conductive type semiconductor substrate including the pillar;

forming the gate electrode by selectively patterning the gate insulating layer and the conductive layer; and forming a spacer at a sidewall of the gate electrode.

2. The method of claim 1, further comprising:

forming an insulating interlayer on the entire surface of the first conductive type semiconductor substrate including the gate electrode;

forming contact holes in the insulating interlayer to expose predetermined portions of the second conductive type impurity ions areas and the gate electrode; and forming electrodes for being electrically connected with the second conductive type impurity ion areas and the gate electrode by the contact holes.

3. The method of claim 1, wherein the halo-ions areas are formed by implanting the first conductive type impurity ions at an energy between 5 KeV and 50 KeV and a density between 1E14 and 5E14 ions/cm².

4. The method of claim 1, wherein the first conductive type halo-ion areas are formed by implanting halo-type ions at an angle of from 5° to 30° relative to a vertical axis of the surface of the first conductive type semiconductor substrate.

5. A method for fabricating a semiconductor device comprising:

forming a sacrificial oxide layer on a first conductive type semiconductor substrate;

forming an aperture in the sacrificial oxide layer to expose a predetermined portion of the first conductive type semiconductor substrate;

forming a polysilicon layer in the aperture;

removing the sacrificial oxide layer;

forming first conductive type halo-ion areas in the polysilicon layer and the first conductive type semiconductor substrate at sides of the polysilicon layer;

forming second conductive type impurity ion areas on the halo-ion areas at sides of the polysilicon layer;

sequentially depositing a gate insulating layer and a conductive layer for a gate electrode on an entire surface of the first conductive type semiconductor substrate including the polysilicon layer;

forming a gate electrode by selectively patterning the gate insulating layer and the conductive layer; and forming a spacer at a sidewall of the gate electrode.

6. The method of claim 5, further comprising:

forming an insulating interlayer on the entire surface of the first conductive type semiconductor substrate including the gate electrode;

forming contact holes in the insulating interlayer to expose predetermined portions of the second conductive type impurity ions areas and the gate electrode; and forming electrodes for being electrically connected wit the second conductive type impurity ions areas and the gate electrode by the contact holes.

7. The method of claim 5, wherein the halo-ion areas are formed by implanting first conductive impurity ions at an energy between 5 KeV and 50 KeV and a density between 1E14 and 5E14 ions/cm².

8. The method of claim 5, wherein the halo-ion areas are formed by implanting halo-type ions at an angle of from 5° to 30° relative to a vertical axis of the surface of the substrate.

9. The method of claim 5, wherein the sacrificial oxide layer has a thickness of from 1000 Å to 5000 Å.

10. The method of claim 1, wherein selectively patterning the gate insulating layer and the conductive layer comprises leaving unetched portions of the gate insulating layer and the conductive layer over a top surface of the pillar, side surfaces of the pillar, and horizontal areas of the substrate adjacent to the pillar.

11. The method of claim 2, wherein forming second conductive type impurity ion areas comprises forming a drain region over the halo ion area within the pillar, and forming a source region above the halo ion area within the substrate adjacent to the pillar.

12. The method of claim 11, wherein forming electrodes comprises forming a second gate electrode electrically connected with the gate electrode, a source electrode electrically connected with the source region, and a drain electrode electrically connected with the drain region.

13. The method of claim 1, wherein forming second conductive type impurity ion areas comprises implanting impurity ions at an, energy between 5 KeV and 50 KeV and a density between 1E14 and 5E14 ions/cm².

14. The method of claim 1, wherein selectively etching a first conductive type semiconductor substrate comprises removing portions of the substrate adjacent to the pillar having a thickness of about 1 μm to 2 μm.

15. The method of claim 1, further comprising forming a buffering oxide layer prior to forming a pillar.

16. The method of claim 1, wherein forming the spacer comprises:

forming an insulating layer comprising an oxide layer and a nitride layer, and having a thickness between about 600 Å and 2000 Å; and etching back the insulating layer until horizontal surfaces of the gate electrode are exposed.

17. The method of claim 5, wherein selectively patterning the gate insulating layer and the conductive layer comprises leaving unetched portions of the gate insulating layer and the conductive layer over a top surface of the pillar, side surfaces of the pillar, and adjacent horizontal areas of the substrate.

18. The method of claim 6, wherein forming second conductive type impurity ion areas comprises forming a drain region over the halo ion area within the pillar, and forming a source region above the halo ion area within the substrate adjacent to the pillar.

19. The method of claim 18, wherein forming electrodes comprises forming a second gate electrode electrically connected with the gate electrode, a source electrode electrically connected with the source region, and a drain electrode electrically connected with the drain region.

20. The method of claim 5, wherein forming the polysilicon layer in the aperture comprises epitaxially growing polysilicon to a thickness between about 0.5 μm and 3 μm.

* * * * *